US011317546B2

(12) United States Patent
Pradeepkumar et al.

(10) Patent No.: US 11,317,546 B2
(45) Date of Patent: Apr. 26, 2022

(54) VEHICLE POWER MODULE ASSEMBLY

(71) Applicant: Ford Global Technologies, LLC, Dearborn, MI (US)

(72) Inventors: Akash Changarankumarath Pradeepkumar, Westland, MI (US); Alfredo R. Munoz, Ann Arbor, MI (US); Michael W. Degner, Novi, MI (US); Edward Chan-Jiun Jih, Troy, MI (US); Guangyin Lei, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 684 days.

(21) Appl. No.: 16/018,544

(22) Filed: Jun. 26, 2018

(65) Prior Publication Data

US 2019/0394907 A1    Dec. 26, 2019

(51) Int. Cl.
*H05K 7/20* (2006.01)
*B60L 58/10* (2019.01)
*H02M 7/00* (2006.01)
*H01L 23/473* (2006.01)

(52) U.S. Cl.
CPC .......... *H05K 7/20927* (2013.01); *B60L 58/10* (2019.02); *H05K 7/20254* (2013.01); *H01L 23/473* (2013.01); *H02M 7/003* (2013.01)

(58) Field of Classification Search
CPC ........... H05K 7/20927; H05K 7/20254; H05K 7/20872; B60L 58/10; B60L 2240/525; B60L 15/007; H02M 7/003; H01L 23/473; Y02T 10/70; Y02T 10/64

USPC ........................................................ 361/699
See application file for complete search history.

(56) References Cited

U.S. PATENT DOCUMENTS

| 7,957,169 | B2 | 6/2011 | Nakajima et al. | |
|---|---|---|---|---|
| 8,693,193 | B2 | 4/2014 | Ishibashi et al. | |
| 9,721,875 | B2 | 8/2017 | Yoshihara et al. | |
| 2003/0207624 | A1* | 11/2003 | Milan | G06F 13/4095 439/752.5 |
| 2009/0146293 | A1* | 6/2009 | Olesen | H05K 7/20927 257/714 |
| 2011/0318884 | A1* | 12/2011 | Noritake | H01L 23/3135 438/122 |
| 2012/0001341 | A1* | 1/2012 | Ide | H01L 25/117 257/773 |

(Continued)

*Primary Examiner* — Anatoly Vortman
*Assistant Examiner* — Zhengfu J Feng
(74) *Attorney, Agent, or Firm* — David B. Kelley; Brooks Kushman P.C.

(57) ABSTRACT

A vehicle power module assembly including first and second power modules is provided. The first power module may include a first lock feature extending from a lower portion of a first minor side at a first central axis. The second power module may include a second lock feature at an upper portion of a second minor side at a second central axis. The lock features may be sized for interlock with one another to secure the power modules to one another. The first lock feature may be a loop element defining a through-hole and the second lock feature may be a wedge. The through-hole may be sized for the wedge to extend therein and to interlock the first power module and the second power module to one another. The first lock feature may be a flexible hook element and the second lock feature may be a slot.

6 Claims, 10 Drawing Sheets

(56) References Cited

U.S. PATENT DOCUMENTS

2017/0265337 A1\* 9/2017 Lei .................. H02M 7/003
2018/0062145 A1\* 3/2018 Yang ................ H01R 31/06

\* cited by examiner

VEHICLE POWER MODULE ASSEMBLY

TECHNICAL FIELD

The present disclosure relates to vehicle power module assemblies.

BACKGROUND

A vehicle power unit may be formed by stacking and connecting a number of power modules based on vehicle power requirements. Pins from the power modules interface with adjacent power electronics.

SUMMARY

A vehicle power module assembly includes a first power module and a second power module. The first power module includes a first lock feature extending from a lower portion of a first minor side at a first central axis. The second power module includes a second lock feature at an upper portion of a second minor side at a second central axis. The lock features are sized for interlock with one another to secure the power modules to one another. The first lock feature may be a loop element defining a through-hole and the second lock feature may be a wedge. The through-hole may be sized for the wedge to extend therein and to interlock the first power module and the second power module to one another. The first lock feature may be a flexible hook element and the second lock feature may be a slot. The slot may be sized to receive a portion of the hook element to interlock the first power module and the second power module to one another. The first power module may further include a second first lock feature extending from a lower portion of a first major side. The second power module may further include another second lock feature at an upper portion of a second major side. The second first lock feature may be arranged with the another second lock feature such that interlocking of corresponding lock features applies a clamping force sufficient to create a sealed relationship between the first power module and the second power module. The lock features may be arranged upon respective minor sides at respective central axes such that a third power module having a design substantially identical to the first power module or the second power module may be secured in a stack to the first power module or the second power module. The first power module may further include an extension extending about and spaced inward from a perimeter of a lower surface portion of the first power module. The second power module may further include a groove extending about and spaced inward from a perimeter of an upper surface portion of the second power module. The extension and groove may be arranged with one another to align a first coolant channel of the first power module in substantial registration with a second coolant channel of the second power module. The first power module or the second power module may further include two pairs of coolant channels extending therethrough and a coolant cavity connecting two of the two pairs of coolant channels such that coolant flow is directed across a heat generating component disposed within the power module.

A vehicle power module assembly includes a first power module and a second power module. The first power module includes a first pair of opposing major sides, each of the first pair of opposing major sides including a flange extending therefrom and each flange including a grasp element. The second power module includes a second pair of opposing major sides and an upper portion spaced from a lower portion to define a pair of grooves therebetween and each located adjacent to one of the second pair of opposing major sides. Each groove extends a length of one of the major sides and each groove is sized to receive one of the grasp elements such that one of the first pair of opposing major sides is substantially flush with one of the second pair of opposing major sides when the first power module and the second power module are secured to one another. The second power module may further include an upper portion having at least one side face defining a first plane offset from a second plane defined by one of the first pair of opposing major sides of the first power module. The flanges of the first power module may be spaced from one another to define a cavity sized to at least partially receive the upper portion of the second power module therebetween. The first power module may include at least a first coolant channel extending therethrough. The second power module may include at least a second coolant channel therethrough. The grooves and grasp elements may be arranged with one another such that the first coolant channel and the second coolant channel are in substantial registration with one another when the first power module and the second power module are secured to one another. The grooves and grasp elements may be arranged with one another such that there are no fasteners projecting externally from the power modules when secured to one another. The first power module or the second power module may further include two pairs of coolant channels extending therethrough and a coolant cavity connecting two of the two pairs of coolant channels such that coolant flow is directed across a heat generating component disposed within the power module. The assembly may further include a third power module. The first power module, the second power module, and the third power module may each include a substantially identical structure such that the third power module may be mounted to the first power module or the second power module.

A vehicle power module assembly includes a first power module and a second power module. The first power module includes a lower portion defining a perimeter sidewall, a cavity within the perimeter sidewall, and an inner extension extending about a cavity perimeter spaced inward from the perimeter sidewall. The second power module includes an upper portion spaced from a lower portion to define a groove therebetween extending about a perimeter of the upper portion. The upper portion of the second power module is sized for disposal within the cavity of the lower portion of the first power module such that the inner extension sits within the groove to align the first power module and the second power module for securement to one another. The groove of the second power module may be sized to receive sealant to seal the inner extension therein. The first power module may further include a first coolant channel. The second power module may further include a second coolant channel. The first power module and the second power module may be secured to one another such that the first coolant channel is in fluid communication with the second coolant channel and sealed to prevent leakage of coolant traveling within one of the coolant channels. The inner extension may sit within the groove such that a first side of the first power module is substantially flush with a second side of the second power module. The inner extension may sit within the groove such that no fasteners project externally to the first power module or the second power module. The first power module may include one or more switching units disposed therein. The first power module may further define two pairs of coolant channels and a coolant cavity fluidly connecting two of the two pairs of coolant channels. The coolant cavity may be arranged within the first power module such that coolant disposed therein may travel across the one or more switching units to manage thermal conditions thereof.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1A:
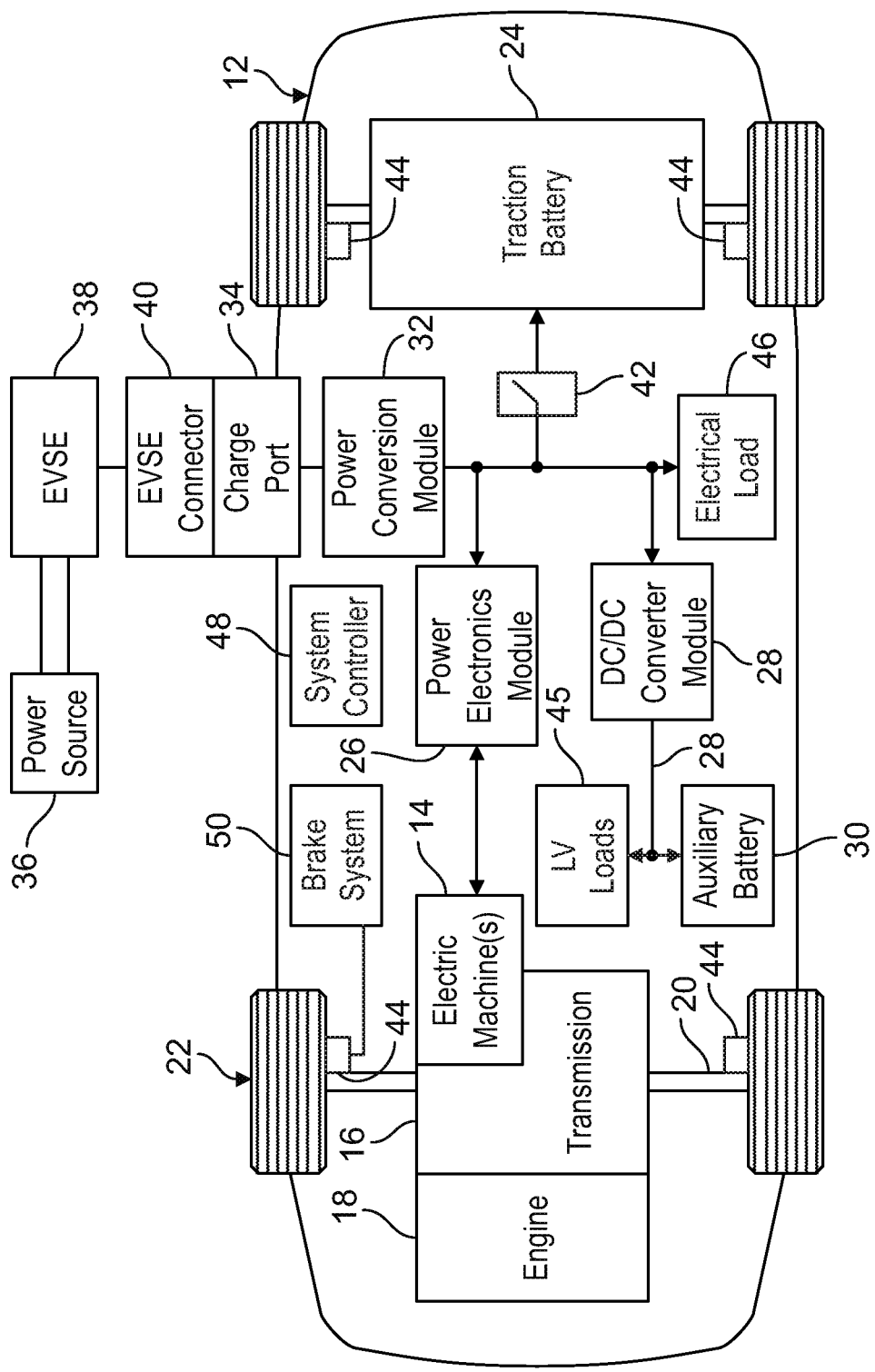
FIG. 1A is a schematic diagram illustrating an example of an electrified vehicle.

FIG. 1A illustrates an example of an electrified vehicle, referred to as an electrified vehicle 12 herein. In this example, the electrified vehicle is shown as a plug-in hybrid electric vehicle (PHEV). The electrified vehicle 12 may include one or more electric machines 14 mechanically coupled to a gearbox or hybrid transmission 16. Each of the electric machines 14 may be capable of operating as a motor and a generator. In addition, the hybrid transmission 16 is mechanically coupled to an engine 18 and the hybrid transmission 16 is mechanically coupled to a drive shaft 20 that is mechanically coupled to a set a set of wheels 22. The electric machines 14 may provide propulsion and deceleration capability when the engine 18 is turned on or off. The electric machines 14 may also act as generators and provide fuel economy benefits by recovering energy that would normally be lost as heat in a friction braking system. The electric machines 14 may also reduce vehicle emissions by allowing the engine 18 to operate at more efficient speeds and allowing the electrified vehicle 12 to be operated in electric mode with the engine 18 off under certain conditions. The electrified vehicle 12 may also be a battery electric vehicle (BEV), a full hybrid electric vehicle (FHEV), a mild hybrid electric vehicle (MHEV), or other vehicle utilizing an electric drive and/or an electric motor. In a BEV configuration, the engine 18 may not be present.

A battery pack or traction battery 24 stores energy that may be used by the electric machines 14. The traction battery 24 may provide a high voltage direct current (DC) output. A contactor module 42 may include one or more contactors to isolate the traction battery 24 from a high-voltage bus 52 when opened and to connect the traction battery 24 to the high-voltage bus when closed. The high-voltage bus may include power and return conductors for carrying current. The contactor module 42 may be located adjacent to or within the traction battery 24. One or more power electronics modules 26 (which may also be referred to as an inverter or power module) may be electrically coupled to the high-voltage bus. The power electronics modules 26 are electrically coupled to the electric machines 14 and provide the ability to bi-directionally transfer energy between the traction battery 24 and the electric machines 14. For example, a traction battery 24 may provide a DC voltage while the electric machines 14 may operate with a three-phase alternating current (AC). The power electronics module 26 may convert the DC voltage to a three-phase AC current to operate the electric machines 14. In a regenerative mode, the power electronics module 26 may convert the three-phase AC current from the electric machines 14 acting as generators to the DC voltage compatible with the traction battery 24.

In addition to providing energy for propulsion, the traction battery 24 may provide energy for other vehicle electrical systems. The electrified vehicle 12 may include a DC/DC converter module 28 that converts the high voltage DC output from the high-voltage bus to a low-voltage DC level of a low-voltage bus that is compatible with low-voltage loads 45. An output of the DC/DC converter module 28 may be electrically coupled to an auxiliary battery 30 (e.g., a 12V battery) for charging the auxiliary battery 30. The low-voltage loads 45 may be electrically coupled to the auxiliary battery 30 via the low-voltage bus. One or more high-voltage electrical loads 46 may be coupled to the high-voltage bus. The high-voltage electrical loads 46 may have an associated controller that operates and controls the high-voltage electrical loads 46 when appropriate. Examples of high-voltage electrical loads 46 may be a fan, an electric heating element and/or an air-conditioning compressor.

In a PHEV embodiment, the electrified vehicle 12 may be configured to recharge the traction battery 24 via an external power source 36. The external power source 36 may include a connection to an electrical outlet. The external power source 36 may be electrically coupled to a charge station or an electric vehicle supply equipment (EVSE) 38. The external power source 36 may be an electrical power distribution network or grid as provided by an electric utility company. The EVSE 38 may provide circuitry and controls to regulate and manage the transfer of energy between the external power source 36 and the electrified vehicle 12. The external power source 36 may provide DC or AC electric power to the EVSE 38. The EVSE 38 may have a charge connector 40 for coupling to a charge port 34 of the vehicle 12. The charge port 34 may be any type of suitable port configured to transfer power from the EVSE 38 to the vehicle 12. The charge port 34 may be electrically coupled to an on-board power conversion module 32 which may operate as a charger. The power conversion module 32 may condition the power supplied from the EVSE 38 to provide appropriate voltage and current levels to the traction battery 24 and the high-voltage bus. The power conversion module 32 may interface with the EVSE 38 to coordinate the delivery of power to the electrified vehicle 12. The EVSE connector 40 may have pins to mate with corresponding recesses of the charge port 34.

One or more wheel brakes 44 may be provided for decelerating the electrified vehicle 12 and preventing motion of the electrified vehicle 12. The wheel brakes 44 may be hydraulically actuated, electrically actuated, or some combination thereof. The wheel brakes 44 may be a part of a brake system 50. The brake system 50 may include other components to operate the wheel brakes 44.

Figure 1B:
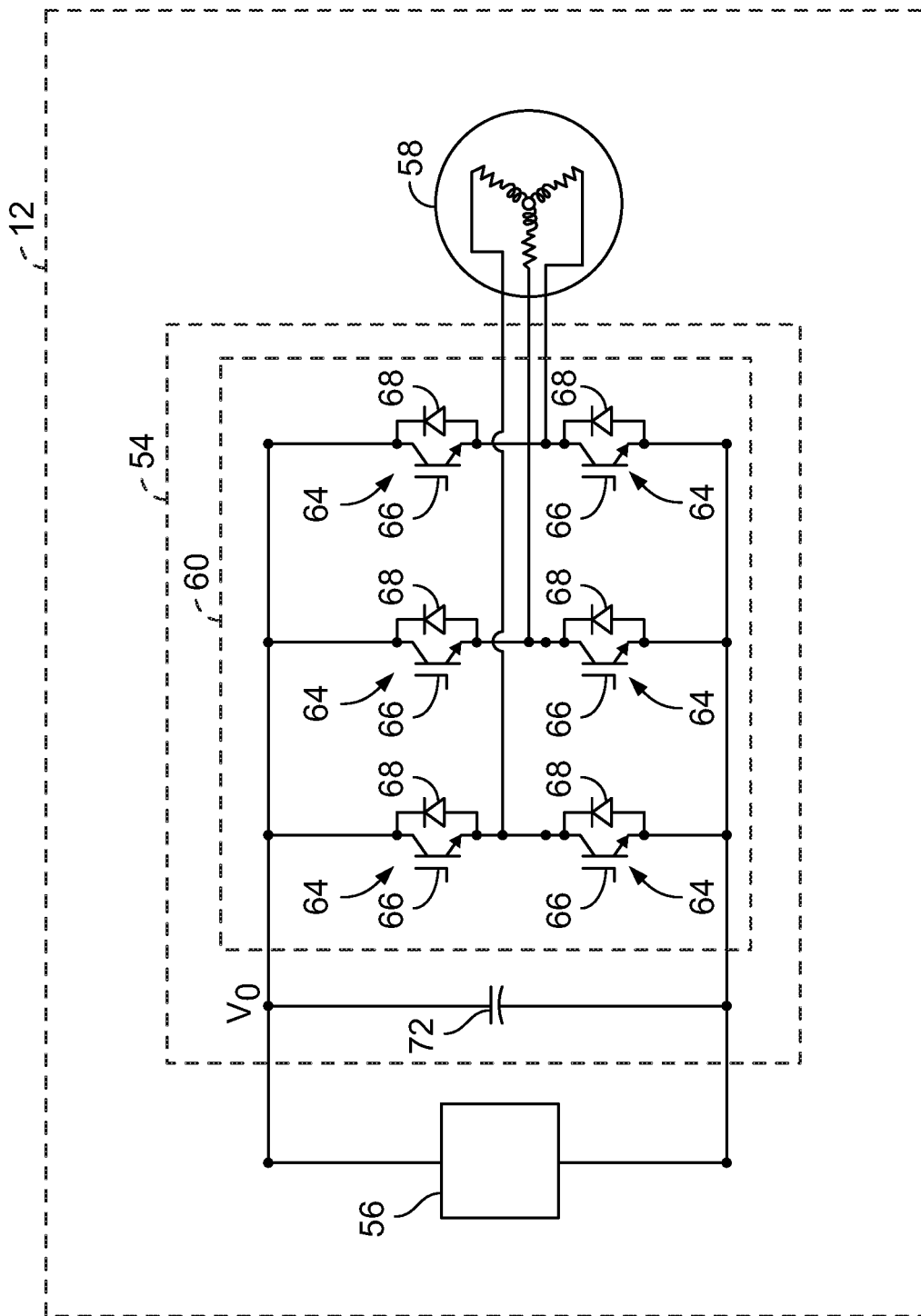
FIG. 1B is a circuit diagram illustrating an example of a power supply device coupled to a power source and a load.

FIG. 1B is a circuit diagram illustrating an example of a power supply device 54 coupled to a power source 56 and a load 58. The power supply device 54 may convert DC electrical current into AC electrical current. The power supply device 54 may be utilized in an electric drive system of a vehicle, such as the electrified vehicle 12 described above. The power source 56 may be coupled to the power supply device 54 in order to drive the load 58. The power source 56 may be a battery, such as the traction battery 24 described above, and the load 58 may be an electric machine, such as one of the electric machines 14 described above. The power source 56 may further comprise a high voltage battery that is coupled to a voltage converter (not shown). The power supply device 54 may include a power assembly or power module 60. The power module 60 may deliver electrical power to the load 58. The power module 60 may be an inverter or an inverter assembly to convert DC electrical current into AC electrical current.

The power module 60 may include inverting circuitry and heat generating components such as a plurality of switching units 64. The power module 60 may be an inverter that includes any number of switching units and is not limited to the number of switching units shown in FIG. 1A. Each of the switching units 64 may include a transistor 66 arranged antiparallel with a diode 68. In one example, the transistor 66 may be an insulated gate bipolar transistor (IGBT). The switching units 64 may provide alternating current to the load 58. The power supply device 54 may include a linking capacitor 72 disposed between the power source 56 and the power module 60. The linking capacitor 72 may absorb ripple currents generated at the power module 60 or the power source 56, and stabilize the DC-link voltage, Vo, for power module 60 control. The linking capacitor 72 may be arranged to limit voltage variation at an input of inverting circuitry due to ripple currents generated by the inverting circuitry in the power module 60 or a battery, such as a traction battery, that may comprise the power source 56. Alternatively, the linking capacitor 72 may be configured to couple one or a plurality of inverters to a power source.

Figure 2A:
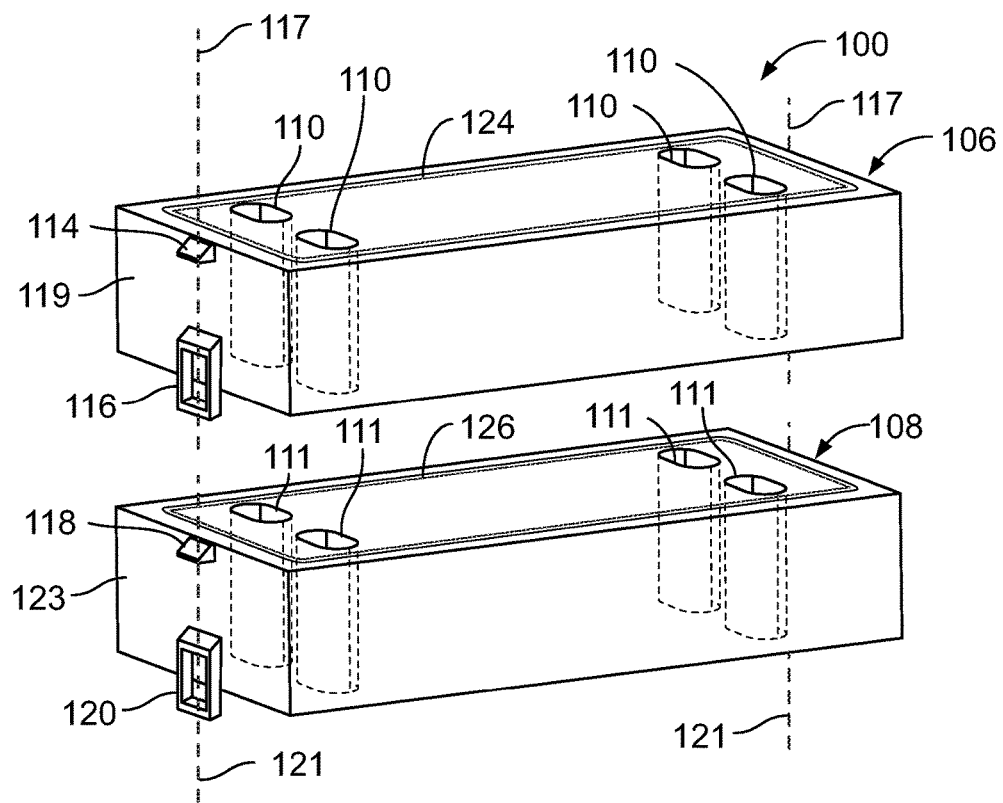
FIG. 2A is an exploded perspective view of an example of two power modules.

FIG. 2A is a partially exploded perspective view illustrating an example of a portion of a power module assembly, referred to generally as a power module assembly 100 herein. The power module assembly 100 includes a first power module 106 and a second power module 108 shown separated from one another in FIG. 2A. Each power module may include one or more coolant channels extending through a respective power module. For example, the first power module 106 may include one or more coolant channels 110 and the second power module 108 may include one or more coolant channels 111.

Each of the coolant channels 110 and each of the coolant channels 111 may be oriented within a respective power module at a location adjacent heat generating components to assist in managing thermal conditions thereof. For example, each of the coolant channels 110 and each of the coolant channels 111 may be located adjacent one or more switching units or a power stage. Each of the coolant channels 110 and each of the coolant channels 111 may also assist in orienting the first power module 106 and the second power module 108 for mounting to one another. Each of the coolant channels 110 and each of the coolant channels 111 may be in fluid communication with a thermal management system (not shown) for coolant to be delivered and removed therefrom.

Figure 2B:
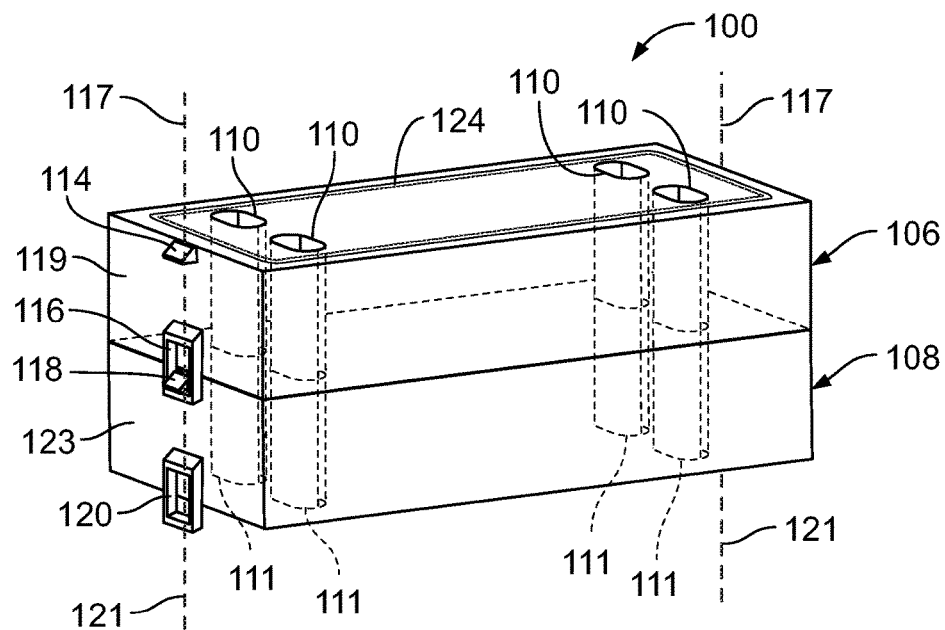
FIG. 2B is a perspective view of the two power modules of FIG. 2A shown mounted to one another.

While two power modules (the first power module 106 and the second power module 108) are shown in FIGS. 2A and 2B, it is contemplated that the power module assembly 100 may include two or more stacked power modules based on vehicle power requirements. A structural design of each of the first power module 106 and the second power module 108 may be utilized in each of a stack of a plurality of power modules without needing to design additional power module embodiments.

Each of the first power module 106 and the second power module 108 may include fastening features or locking features to facilitate securement to and alignment with one another. For example, the first power module 106 may include a pair of first wedge elements 114 and a pair of first loop elements 116. In FIGS. 2A and 2B only one of the pair of first wedge elements 114 and one of the pair of first loop elements 116 is shown due to an orientation of the first power module 106.

The second power module 108 may include a pair of second wedge elements 118 and a pair of second loop elements 120. In FIGS. 2A and 2B only one of the pair of second wedge elements 118 and one of the pair of second loop elements 120 is shown due to an orientation of the second power module 108.

Each of the pair of first wedge elements 114 and each of the pair of first loop elements 116 may be located at a central axis 117 of one of each of a pair of first minor sides 119. For example, each of the pair of first wedge element 114 and each of the pair of first loop elements 116 may be spaced equidistant from respective corners of the first power module 106. It is contemplated that each of the pair of first wedge elements 114 and each of the pair of first loop elements 116 may be located on an axis other than the central axis 117, such as an axis spaced between the central axis 117 and one of the corners of the first power module 106. A location of each of the pair of first wedge elements 114 and each of the pair of first loop elements 116 may be based on a desired clamping force to promote a sealed relationship between the power modules to facilitate coolant flow between the coolant channels. For example, a particular power module may have optimal operating conditions relating to a coolant flow rate and coolant pressure. The location of the wedges elements and loop elements may be selected to obtain a clamping force between the power modules to maintain the desired coolant flow rate and coolant pressure.

In FIGS. 2A and 2B, only one of the pair of first minor sides 119 is shown due to an orientation of the first power module 106. Each of the pair of second wedge elements 118 and each of the pair of second loop elements 120 may be located at a central axis 121 of one of each of a pair of second minor sides 123. For example, each of the pair of second wedge elements 118 and each of the pair of second loop elements 120 may be spaced equidistant from respective corners of the second power module 108. In FIGS. 2A and 2B, only one of the pair of second minor sides 123 is shown due to an orientation of the second power module 108.

Each of the pair of first loop elements 116 may be sized to receive one of the pair of second wedge elements 118 to align and secure the first power module 106 to the second power module 108 as shown in FIG. 2B. Each of the wedge elements and each of the loop elements may be arranged with wedge elements and loop elements of the other of the power modules to secure the power modules to one another to facilitate a sealed relationship between the first power module 106 and the second power module 108 and to prevent coolant leakage.

The first power module 106 and the second power module 108 may include additional features to assist in aligning respective coolant channels with one another and to assist in aligning respective fastening features with one another. For example, the first power module 106 may include a first groove 124 at an upper portion and the second power module 108 may include a second groove 126 at an upper portion. The first power module 106 may include a first extension 128 at a lower surface and the second power module 108 may include a second extension 130 at a lower portion. Each extension may be sized to sit within a respective groove. Each of the grooves may be arranged with a respective extension to assist in aligning the coolant channels 110 of the first power module 106 in substantial registration with the coolant channels 111 of the second power module 108.

It is contemplated that a third power module (not shown) may include a structural design substantially identical to one of the first power module 106 or the second power module 108 for securement to the first power module 106 or the second power module 108 in a stack. For example, the third power module may include fastening features for alignment with corresponding fastening features of the first power module 106 or the second power module 108. The structural design of the first power module 106 and the second power module 108 provides flexibility to utilize various numbers of power modules in a stack based on vehicle power requirements, e.g. higher power requirements may use two or more power modules.

Figure 2C:
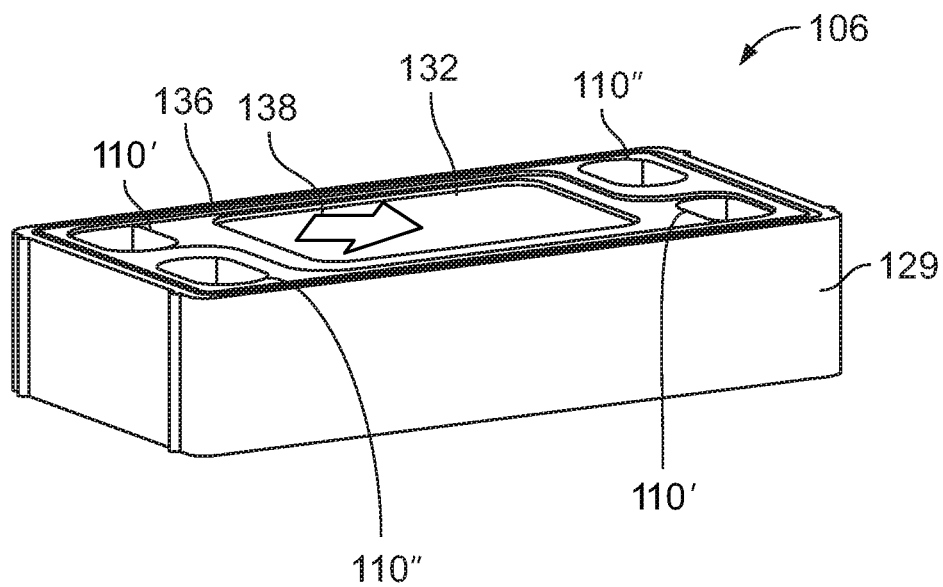
FIG. 2C is a first perspective view of a portion of one of the two power modules of FIG. 2A showing a coolant channel configuration.
Figure 2D:
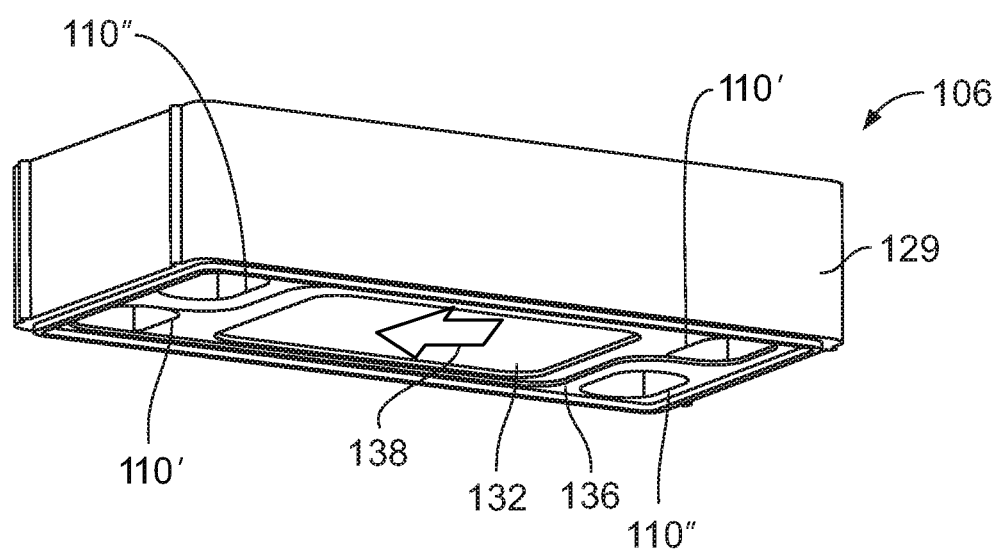
FIG. 2D is a second perspective view of the portion of the one of the two power modules of FIG. 2C.

FIGS. 2C and 2D illustrate an example of an internal structure of the first power module 106 relating to the coolant channels 110. In FIGS. 2C and 2D a first pair of the coolant channels 110 is referred to as a first pair of coolant channels 110' and a second pair of the coolant channels 110 is referred to as a second pair of coolant channels 110" for clarity. The first power module 106 may include a frame 129 for retaining electrical components, such as a power stage 132. The power stage 132 may include one or more switching units that generate heat during operation. The frame 129 may define a coolant cavity 136 on each side. Each of the coolant cavities 136 fluidly connects one or the first pair of coolant channels 110' or the second pair of coolant channels 110". For example, each of the coolant cavities 136 may be arranged with respective coolant channels such that coolant flows across the power stage 132 as represented by arrows 138. It is contemplated that each of the coolant cavities 136 may have various shapes to promote desired coolant flow across or adjacent the power stage 132.

Figure 3A:
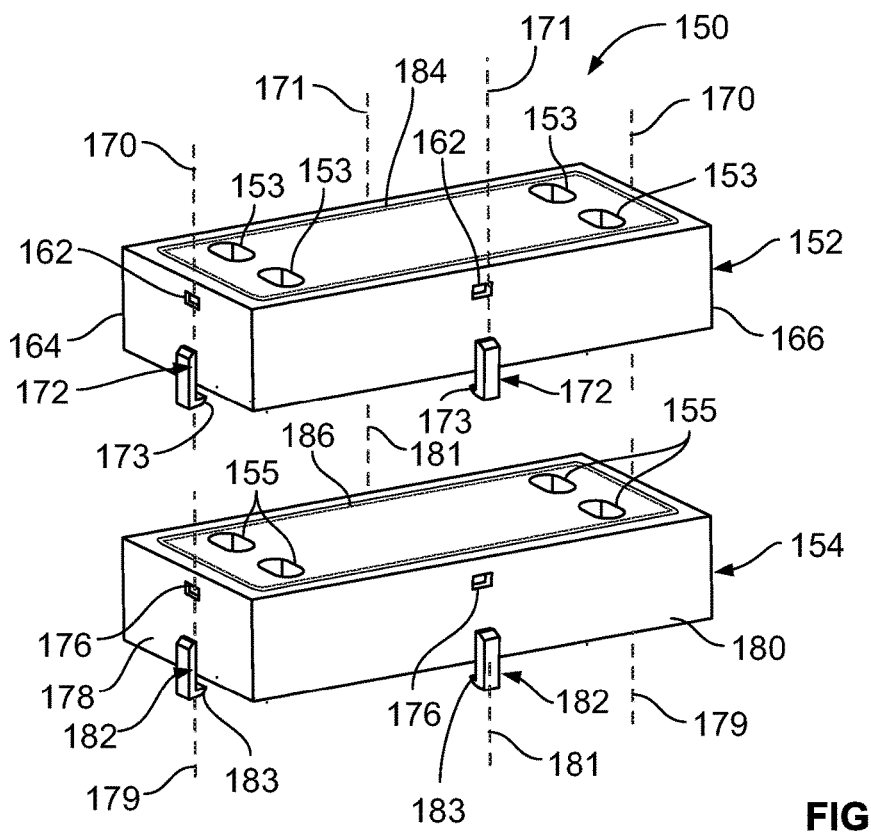
FIG. 3A is an exploded upper perspective view of an example of two power modules.
Figure 3B:
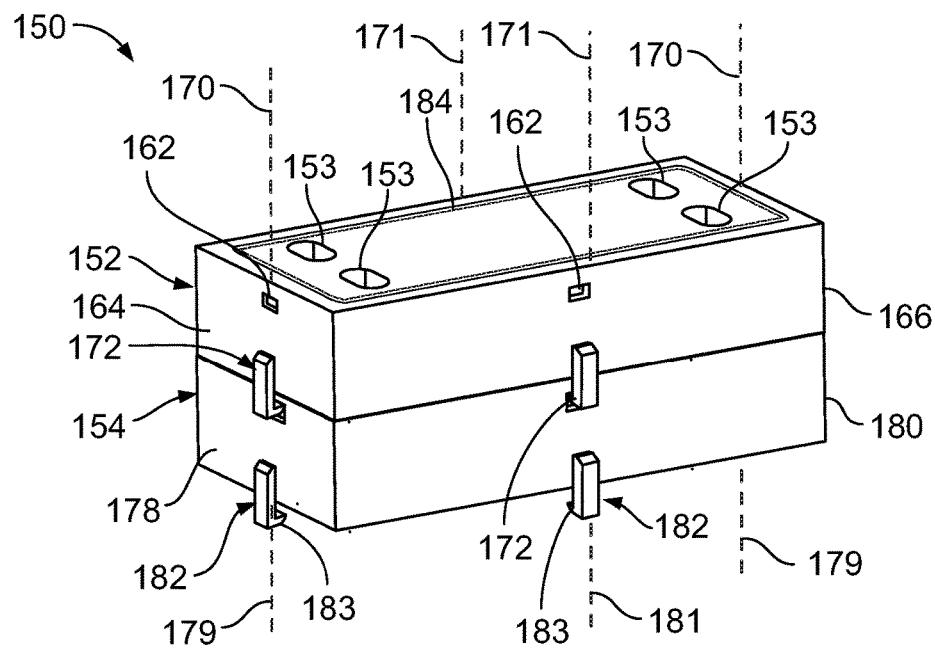
FIG. 3B is a perspective view of the two power modules of FIG. 3A shown mounted to one another.
Figure 3C:
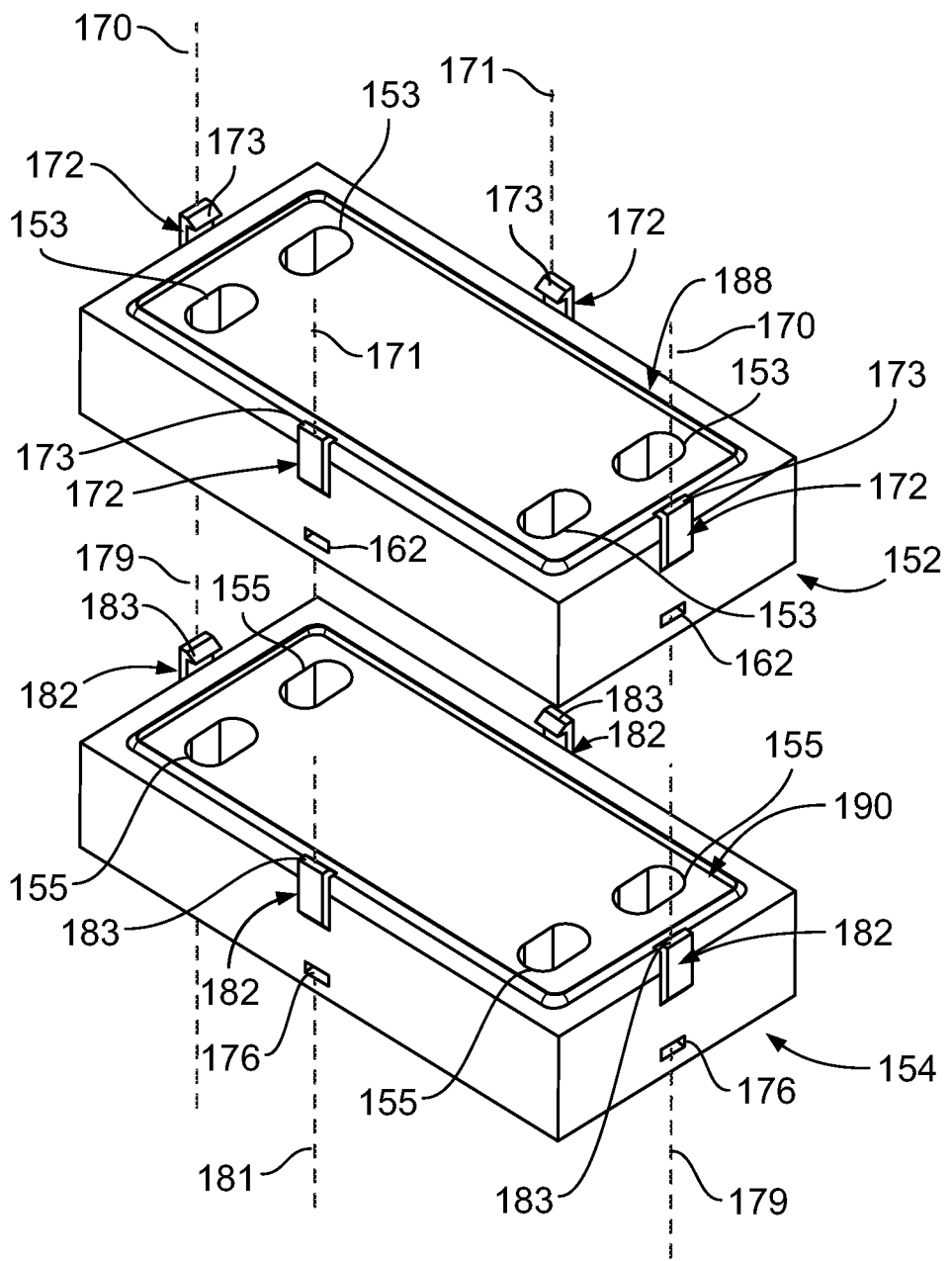
FIG. 3C is an exploded lower perspective view of the two power modules of FIG. 3A

FIGS. 3A through 3C show another example of a power module assembly, referred to generally as a power module assembly 150 herein. The power module assembly 150 may include a first power module 152 and a second power module 154. Each of the first power module 152 and the second power module 154 include fastening features, locking features, and/or alignment features to assist in mounting the power modules to one another, to assist in positioning one or more coolant channels of each power module in substantial registration with coolant channels of the other of the power modules, and to facilitate a sealed relationship between the power modules. The first power module 152 may include one or more coolant channels 153 and the second power module 154 may include one or more coolant channels 155.

Each of the one or more coolant channels 153 and each of the one or more coolant channels 155 may be oriented within a respective power module at a location adjacent heat generating components to assist in managing thermal conditions thereof. For example, each of the one or more coolant channels 153 and each of the one or more coolant channels 155 may be located adjacent one or more switching units or a power stage. In another example, a coolant cavity may be defined between respective pairs of coolant channels to direct coolant across the heat generating component as described in relation to FIGS. 2C and 2D.

In one example of fastening features, the first power module 152 may include one or more first slots 162 located on one or both of a pair of power module minor sides 164 and one or both of a pair of power module major sides 166. Each of the one or more first slots 162 may be located at a central axis 170 of a respective power module minor side 164 or a central axis 171 of a respective power module major side 166. In FIGS. 3A and 3B, only two of the first slots 162, one of each of the pair of power module minor sides 164, and one of each of the pair of the power module major sides 166 are shown due to an orientation of the first power module 152.

Each of the central axes 170 may be located at a region substantially equidistant from each of two adjacent corners of the respective power module. The first power module 152 may further include a first hook element 172 located on one or both of the power module minor sides 164 and one or both of the power module major sides 166. Each of the first hook elements 172 may be flexible and include a hook 173 sized for inserting within a slot of a power module located below and as further described herein. Each of the first hook elements 172 may be located at a respective central axis 170 aligned with a respective one of the one or more first slots 162.

The second power module 154 may include one or more second slots 176 located on one or both of two power module minor sides 178 and one or both of two power module major sides 180. Each of the one or more second slots 176 may be located at a respective central axis 179 or a central axis 181 and each may be sized to receive one of the hooks 173 to secure the first power module 152 to the second power module 154. The second power module 154 may further include a second hook element 182 located on one or both of the two power module minor sides 178 and one or both of the two power module major sides 180. Each of the second hook elements 182 may be flexible and include a hook 183 sized for inserting within a slot of a power module located below the second power module 154. Alternatively, each hook 183 may be sized for grasping a portion of a supporting surface, such as a tray or support structure (not shown). Each of the second hook elements 182 may be located at a respective central axis 179 or central axis 181 aligned with a respective one of the one or more second slots 176.

It is contemplated that each of the slots and hook elements may be located on an axis other than the central axis 170 or the central axis 171, such as an axis spaced between a respective central axis and the respective power module corners. A location of each of the slots and hook elements may be based on a desired clamping force to promote a sealed relationship between the power modules to facilitate coolant flow between the coolant channels. For example, a particular power module may have optimal operating conditions relating to a coolant flow rate and coolant pressure. The location of the slots and hook elements may be selected to obtain a clamping force between the power modules to maintain the desired coolant flow rate and coolant pressure.

In one example of alignment features, an upper portion of the first power module 152 may include a first groove 184 and an upper portion of the second power module 154 may include a second groove 186. Each of the grooves may extend about and may be spaced inward from a perimeter of the upper portion of a respective power module. A lower portion of the first power module 152 may include a first extension 188 and a lower portion of the second power module 154 may include a second extension 190. Each of the extensions of the first power module 152 and the second power module 154 may extend about and may be spaced inward from a perimeter of the lower portion of a respective power module.

Each of the grooves and extensions may be located upon a respective power module to assist in aligning fastening features of the respective power modules for securement to one another and to assist in aligning corresponding coolant channels for fluid communication therebetween. For example, the second groove 186 and the first extension 188 may be arranged with one another such that the first extension 188 rests within the second groove 186 when the first power module 152 and the second power module 154 are secured to one another. The arrangement between the first extension 188 and the second groove 186 may also assist in aligning central axes 170 and central axes 171 of the first power module 152 with corresponding central axes 179 and central axes 181 of the second power module 154. Alignment of the central axes further assists in aligning respective hook elements for insertion within respective slots to secure the first power module 152 and the second power module 154 with one another. Each of the grooves may be sized to receive a sealant material to assist in securing a respective extension within a respective groove.

It is contemplated that a third power module (not shown) may include a structural design substantially identical to one of the first power module 152 or the second power module 154 for securement to the first power module 152 or the second power module 154 in a stack. For example, the third power module may include fastening features for alignment with corresponding fastening features of the first power module 152 or the second power module 154. The structural design of the power modules provides flexibility to utilize a number of power modules in a stack based on vehicle power requirements, e.g. higher power requirements may use two or more power modules.

Figure 4A:
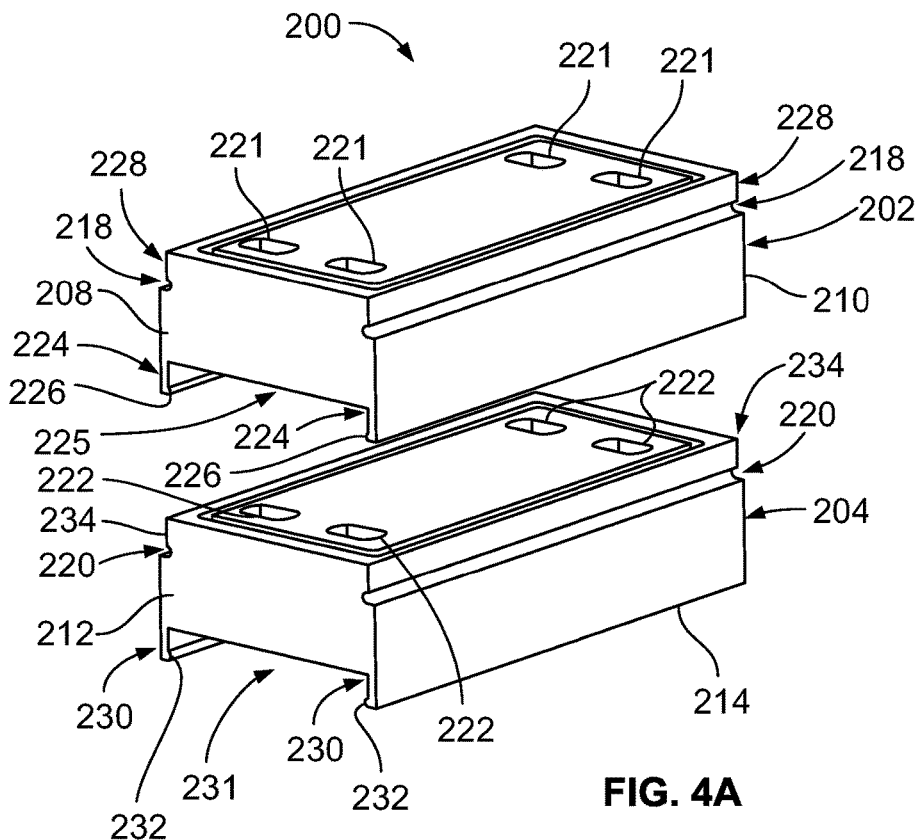
FIG. 4A is an exploded perspective view of an example of two power modules.
Figure 4B:
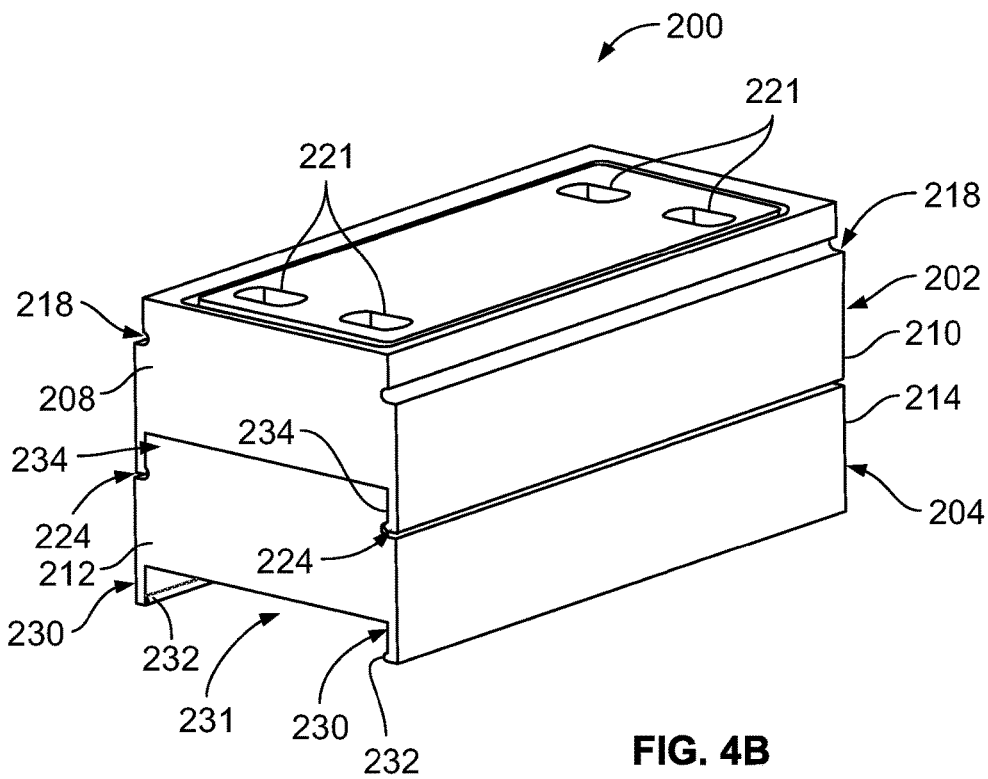
FIG. 4B is a perspective view of the two power modules of FIG. 4A shown mounted to one another.

FIGS. 4A and 4B show another example of a power module assembly, referred to generally as a power module assembly 200 herein. The power module assembly 200 may include a first power module 202 and a second power module 204 each having fastening features and alignment features. The first power module 202 may include a pair of first minor sides 208 and a pair of first major sides 210. The second power module 204 may include a pair of second minor sides 212 and a pair of second major sides 214. The first power module 202 may include a pair of first side grooves 218 extending a length of one of the pair of first major sides 210. The second power module 204 may include a pair of second side grooves 220 extending a length of one of the pair of second major sides 214.

The first power module 202 may include one or more coolant channels 221 and the second power module 204 may include one or more coolant channels 222. Each of the coolant channels may be located adjacent heat generating components (not shown) included within a respective power module. For example, each of the one or more coolant channels 221 and each of the one or more coolant channels 222 may be located adjacent one or more switching units or a power stage. In another example, a coolant cavity may be defined between respective pairs of coolant channels to direct coolant across the heat generating component as described in relation to FIGS. 2C and 2D.

Figure 4C:
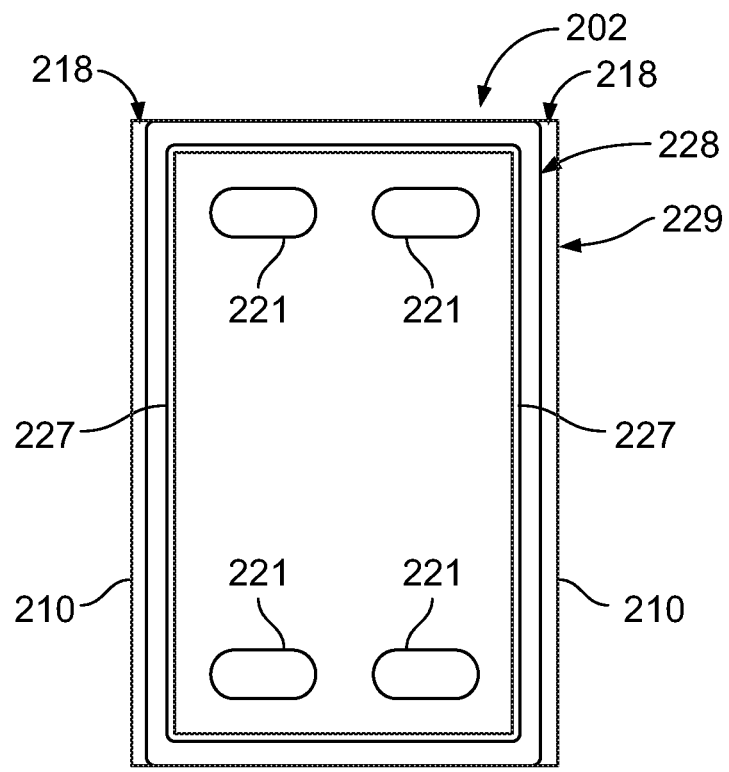
FIG. 4C is a top plan view of a portion of one of the power modules of FIG. 4A.

The first power module 202 may include a pair of first flanges 224 each extending from one of the first major sides 210 and defining a cavity 225 therebetween. Each of the pair of first flanges 224 may be flexible and include a first grasp element 226. The first power module 202 may include a first upper portion 228 offset from a first lower portion 229 to define each of the pair of first side grooves 218 therebetween. For example, a pair of side faces 227 of the first upper portion 228 may each define a first upper plane offset from a first lower plane defined by a respective one the pair of first major sides 210 as further illustrated in FIG. 4C. A cross-sectional area of an upper surface of the first upper portion 228 may be less than a cross-sectional area of the first lower portion 229 to assist in facilitating securement to another power module, such as the second power module 204.

The second power module 204 may include a pair of second flanges 230 each extending from one of the second major sides 214 and defining a cavity 231 therebetween. Each of the pair of second flanges 230 may be flexible and include a second grasp element 232. The second power module 204 may include a side face of a second upper portion 234 offset from a side face of one of the second flanges 230. For example, each of two side faces of the second upper portion 234 may define a second upper plane offset from a second lower plane defined by respective first major sides 210 and first flanges 224.

Figure 4D:
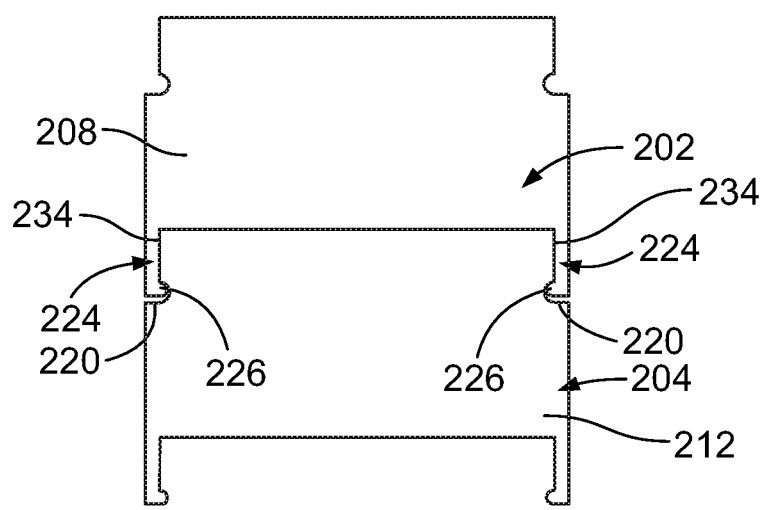
FIG. 4D is a front view, in cross-section, of FIG. 4B showing the two power modules mounted to one another.

FIG. 4D illustrates detail of an example of the fastening features and the alignment features of the power module assembly 200. As mentioned above, each of the first flanges 224 may be of a flexible material such that each of the first flanges 224 may spread outward of the second upper portion 234 to position each of the first grasp elements 226 for interlock within a respective second side groove 220 to secure the first power module 202 to the second power module 204. In this example, the grooves and grasp elements are arranged with one another such that there are no fasteners projecting externally from the power modules when secured to one another. Each of the first grasp elements 226 may be sized to rest within the respective second side groove 220 such that the second upper portion 234 is at least partially disposed within the cavity 225.

It is contemplated that a third power module (not shown) may include a structural design substantially identical to one of the first power module 202 or the second power module 204 for securement to the first power module 202 or the second power module 204 in a stack. For example, the third power module may include fastening features for alignment with corresponding fastening features of the first power module 202 or the second power module 204. The structural design of the power modules provides flexibility to utilize a number of power modules in a stack based on vehicle power requirements, e.g. higher power requirements may use two or more power modules.

Figure 5A:
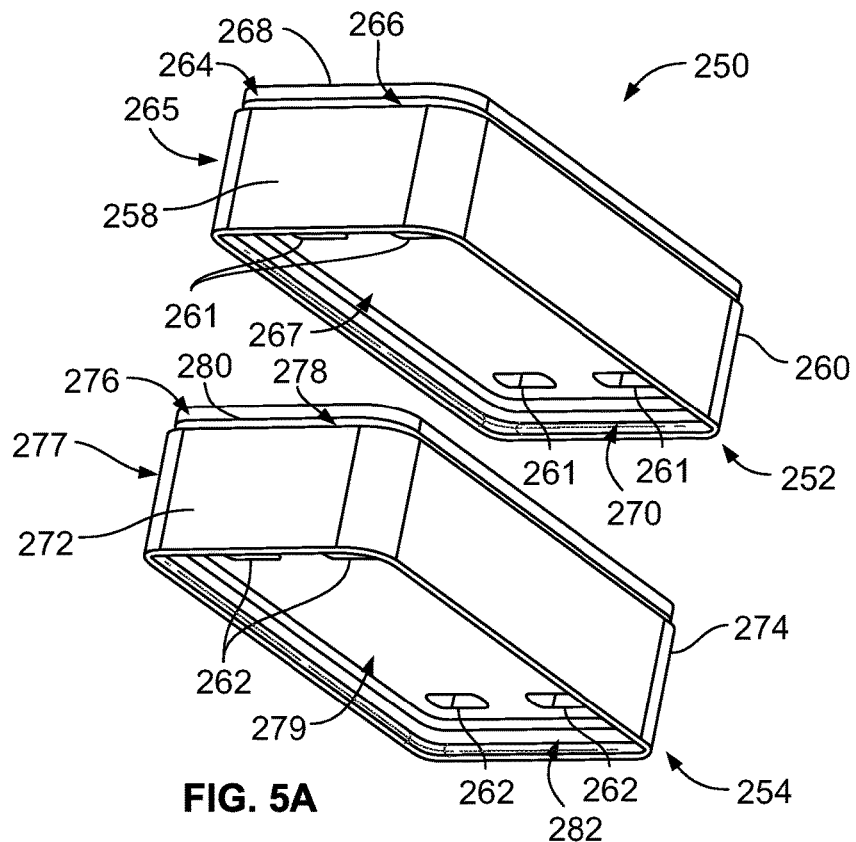
FIG. 5A is an exploded perspective view of an example of two power modules.
Figure 5B:
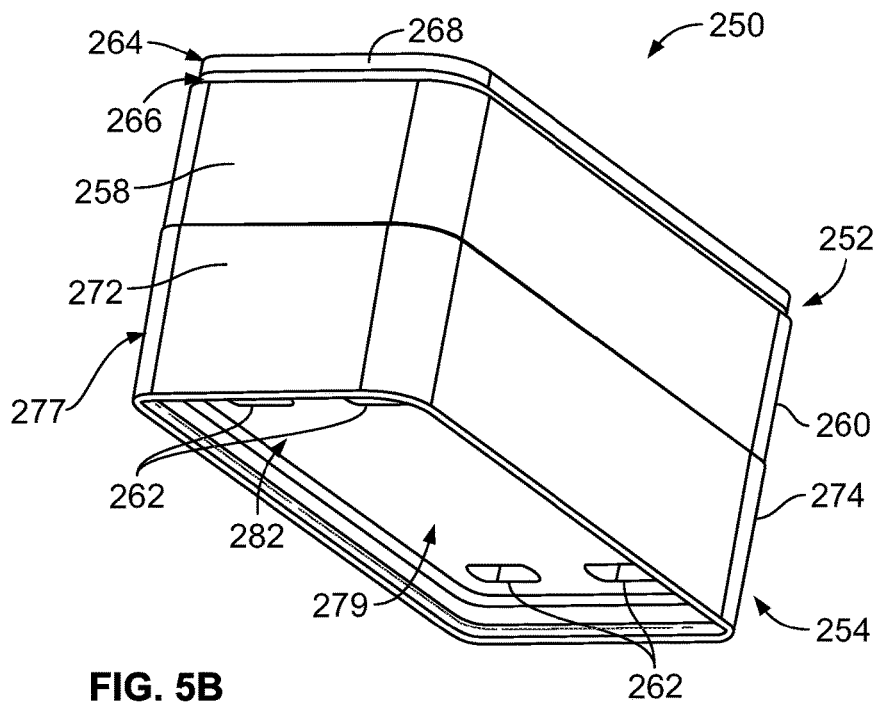
FIG. 5B is a perspective view of the two power modules of FIG. 5A shown mounted to one another.

FIGS. 5A and 5B show another example of a power module assembly, referred to generally as a power module assembly 250 herein. The power module assembly 250 may include a first power module 252 and a second power module 254. Each of the first power module 252 and the second power module 254 may include fastening features and alignment features to assist in securing the first power module 252 to the second power module 254. The first power module 252 may include a pair of first minor sides 258 and a pair of first major sides 260. In FIGS. 5A and 5B only one of the pair of first minor sides 258 and one of the pair of first major sides 260 is visible due to an orientation of the first power module 252.

The first power module 252 may include one or more first coolant channels 261 and the second power module 254 may include one or more second coolant channels 262. Each of the coolant channels may be located adjacent heat generating components (not shown) included within a respective power module. Examples of the heat generating components include switching units or a power stage. For example, each of the one or more first coolant channels 261 and each of the one or more second coolant channels 262 may be located adjacent one or more switching units or a power stage. In another example, a coolant cavity may be defined between respective pairs of coolant channels to direct coolant across the heat generating component as described in relation to FIGS. 2C and 2D.

Figure 5C:
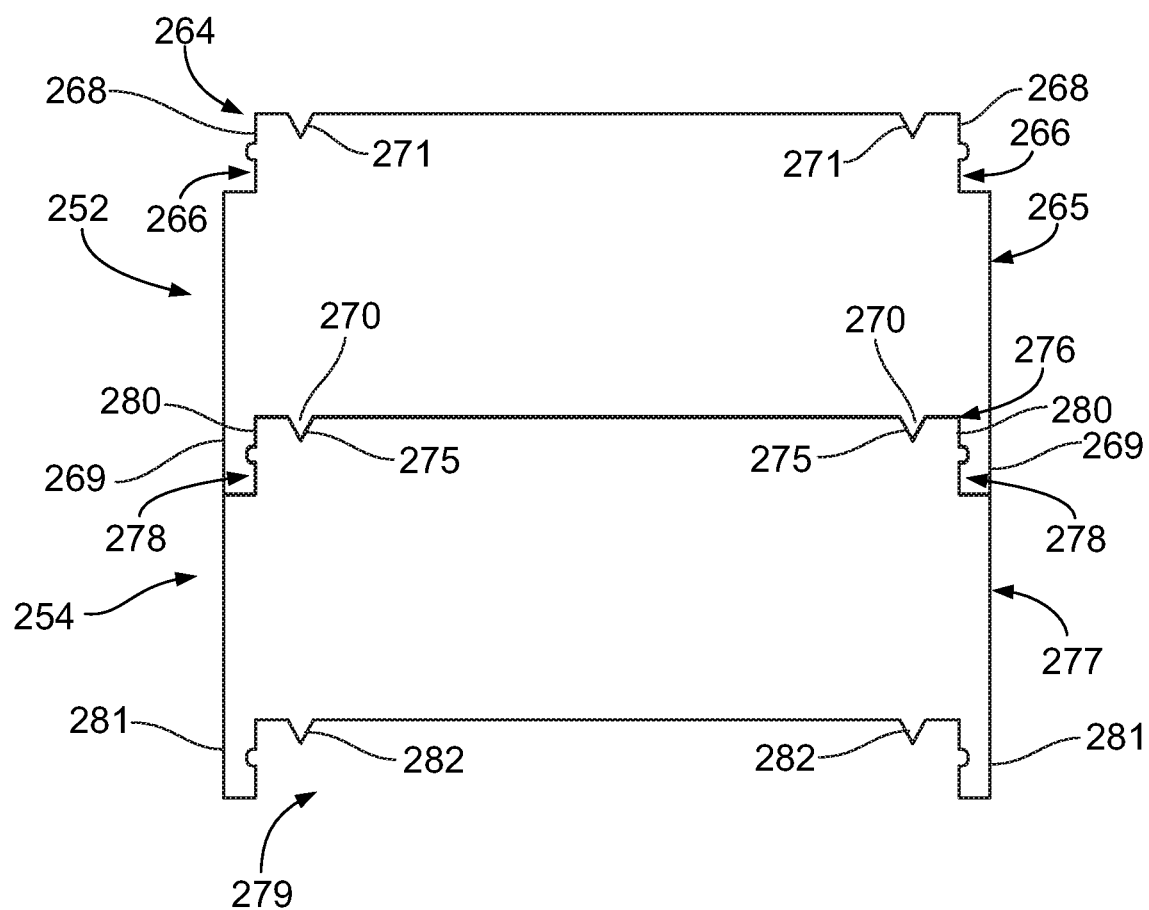
FIG. 5C is a front view, in cross-section, of FIG. 5B showing the power modules of FIG. 5A mounted to one another.

The first power module 252 may further include a first upper portion 264 arranged with a first lower portion 265 to define a first groove 266 therebetween and extending about a perimeter of the first power module 252. The first upper portion 264 may define a first upper surface groove 271 spaced inward from the pair of second minor sides 272 and the pair of second major sides 274. While not visible in FIGS. 5A and 5B due to an orientation of the second power module 254, the second groove 278 is shown in FIG. 5C and is shaped and oriented similar to the first groove 124 of FIG. 2A. The first lower portion 265 may include a first sidewall 269 extending about the perimeter and defining a first cavity 267. The first upper portion 264 may define a first side face 268 extending about a perimeter of the first upper portion 264. The first side face 268 may be spaced inward from planes defined by each of the pair of first minor sides 258 and the pair of first major sides 260. The first power module 252 may include a first extension 270 spaced inward from the first sidewall 269 and within the first cavity 267 as illustrated in FIG. 5C.

As mentioned above, the second power module 254 may also include fastening and alignment features to assist in securing the first power module 252 to the second power module 254. The second power module 254 may include a pair of second minor sides 272 and a pair of second major sides 274. In FIGS. 5A and 5B only one of the pair of second minor sides 272 and one of the pair of second major sides 274 is visible due to an orientation of the second power module 254.

The second power module 254 may further include a second upper portion 276 arranged with a second lower portion 277 to define a second groove 278 therebetween and extending about a perimeter of the second power module 254. The second upper portion 276 may define a second upper surface groove 275 spaced inward from the pair of second minor sides 272 and the pair of second major sides 274. While not visible in FIGS. 5A and 5B due to an orientation of the second power module 254, the second groove 278 is shown in FIG. 5C and is shaped and oriented similar to the first groove 124 of FIG. 2A.

The second lower portion 277 may include a second sidewall 281 extending about the perimeter and defining a second cavity 279. The second upper portion 276 may define a second side face 280 extending about a perimeter of the second upper portion 276. The second side face 280 may be spaced inward from planes defined by each of the pair of second minor sides 272 and the pair of second major sides 274. The second power module 254 may include a second extension 282 extending about an inner perimeter of the second lower portion 277 within the second cavity 279.

FIG. 5C is a front view, in cross-section, illustrating an example of the fastening features securing the first power module 252 to the second power module 254. In this example, the second upper portion 276 of the second power module 254 is disposed within the first cavity 267 of the first power module 252 such that the first extension 270 of the first power module 252 sits within the second upper surface groove 275 of the second power module 254 to secure the first power module 252 to the second power module 254. Portions of the first sidewall 269 of the first lower portion 265 are aligned for a flush relationship with portions of the pair of second minor sides 272 and portions of the pair of second major sides 274.

The grooves and extensions may be arranged with one another such that one of the one or more first coolant channels 261 and one of the one or more second coolant channels 262 are in substantial registration with one another when the first power module 252 and the second power module 254 are secured to one another. The grooves and extensions may also be arranged with one another to create a sealed relationship between the first power module 252 and the second power module 254 such that coolant may flow between the one or more first coolant channels 261 and the one or more second coolant channels 262 without leaking. For example, each of the first upper surface groove 271 and the second upper surface groove 275 may be sized to receive a seal material therein. The seal material may secure a respective extension within a respective groove to assist in preventing leakage of coolant flowing within the coolant channels. Additionally, the grooves and extensions of each power module may be arranged with one another such that there are no fasteners projecting externally from either power module. It is also contemplated that the sidewalls may be of a flexible material to facilitate a snap fit between the first power module 252 and the second power module 254.

It is contemplated that a third power module (not shown) may include a structural design substantially identical to one of the first power module 252 or the second power module 254 for securement to the first power module 252 or the second power module 254 in a stack. For example, the third power module may include fastening features for alignment with corresponding fastening features of the first power module 252 or the second power module 254. The structural design of the power modules provides flexibility to utilize a number of power modules in a stack based on vehicle power requirements, e.g. higher power requirements may use more than two power modules while lower power requirements may use only two power modules.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power module assembly comprising:
a first power module including a first pair of opposing major sides, each of the first pair of opposing major sides including a flange extending therefrom and each flange including a grasp element;
a second power module including a second pair of opposing major sides and an upper portion spaced from a lower portion to define a pair of grooves therebetween and each located adjacent to one of the second pair of opposing major sides,
wherein each groove of the pair of grooves extends a length of one of the major sides, and wherein each groove of the pair of grooves is sized to receive one of the grasp elements such that one of the first pair of opposing major sides is substantially flush with one of the second pair of opposing major sides when the first power module and the second power module are secured to one another; and
a coolant circulation system wherein the first power module and the second power module define two pairs of coolant channels extending through the first power module and the second power module and are disposed within and open into a coolant cavity defined between the first power module and the second power module by a lower surface of the first power module and an upper surface of the second power module, wherein a coolant cavity defining groove extends around a first perimeter of one of the upper surface or the lower surface on one of the first and second power modules and a coolant cavity defining extension extends around a second perimeter of the other of the upper surface or the lower surface provided on the other of the two power modules, wherein the coolant cavity is defined by the coolant cavity defining groove and the coolant cavity defining extension that is received in the coolant cavity defining groove and between the first and second power modules, and wherein the coolant cavity provides fluid communication of coolant between the two pairs of coolant channels across heat generating components disposed within the power modules.

2. The assembly of claim 1, wherein the second power module further includes an upper portion having at least one side face defining a first plane offset from a second plane defined by one of the first pair of opposing major sides of the first power module.

3. The assembly of claim 1, wherein the flanges of the first power module are spaced from one another to define a cavity sized to at least partially receive the upper portion of the second power module therebetween.

4. The assembly of claim 1, wherein the grooves and the grasp elements are arranged with one another such that there are no fasteners projecting externally from the power modules when secured to one another.

5. The assembly of claim 1 further comprising a third power module, wherein the first power module, the second power module, and the third power module each include a substantially identical structure such that the third power module may be mounted to the first power module or the second power module.

6. A vehicle power module assembly comprising:
a first power module including a first pair of opposing major sides, each of the first pair of opposing major sides including a flange extending therefrom and each flange including a grasp element; and
a second power module including a second pair of opposing major sides and an upper portion spaced from a lower portion to define a pair of grooves therebetween and each located adjacent to one of the second pair of opposing major sides,
wherein each groove of the pair of grooves extends a length of one of the major sides, and wherein each groove of the pair of grooves is sized to receive one of the grasp elements such that one of the first pair of opposing major sides is substantially flush with one of the second pair of opposing major sides when the first power module and the second power module are secured to one another, wherein the first power module and the second power module further define a coolant fluid flow path that consists of two pairs of coolant channels extending through each power module of the first and second power modules and are disposed within and open into a coolant cavity connecting the two pairs of coolant channels, wherein the coolant cavity is defined between the first power module and the second power module by a lower surface of the first power module and an upper surface of the second power module, wherein a coolant cavity defining groove extends around a first perimeter of one of the upper surface or the lower surface on one of the first and second power modules and a coolant cavity defining extension extends around a second perimeter of the other of the upper surface or the lower surface provided on the other of the two power modules, wherein the coolant cavity is defined by the coolant cavity defining groove and the coolant cavity defining extension that is received in the coolant cavity defining groove and between the first and second power modules, and wherein the coolant cavity provides fluid communication of coolant between the two pairs of coolant channels across heat generating components disposed within each of the power modules.

* * * * *